(12) United States Patent
Choi et al.

(10) Patent No.: US 10,011,739 B2
(45) Date of Patent: Jul. 3, 2018

(54) COATING COMPOSITION COMPRISING BIS-TYPE SILANE COMPOUND

(71) Applicant: DONGJIN SEMICHEM Co., Ltd., Incheon (KR)

(72) Inventors: Seung-Sock Choi, Hwaseong (KR); Jae-Won Yoo, Hwaseong (KR); Doo-Shik Kim, Hwaseong (KR); Dong-Jin Nam, Hwaseong (KR); Kyung-Min Park, Hwaseong (KR); Seong-Yeon Oh, Hwaseong (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 14/779,372

(22) PCT Filed: Apr. 1, 2014

(86) PCT No.: PCT/KR2014/002785
§ 371 (c)(1),
(2) Date: Sep. 23, 2015

(87) PCT Pub. No.: WO2014/163376
PCT Pub. Date: Oct. 9, 2014

(65) Prior Publication Data
US 2016/0046837 A1 Feb. 18, 2016

(30) Foreign Application Priority Data

Apr. 3, 2013 (KR) .................. 10-2013-0036115

(51) Int. Cl.
| | |
|---|---|
| *C08K 3/04* | (2006.01) |
| *C09D 183/00* | (2006.01) |
| *C09D 183/04* | (2006.01) |
| *C09D 183/14* | (2006.01) |
| *H01L 51/00* | (2006.01) |
| *C09D 5/00* | (2006.01) |
| *C08G 77/50* | (2006.01) |
| *C09D 165/00* | (2006.01) |

(52) U.S. Cl.
CPC ............ *C09D 183/00* (2013.01); *C09D 5/00* (2013.01); *C09D 183/04* (2013.01); *C09D 183/14* (2013.01); *H01L 51/0094* (2013.01); *C08G 77/50* (2013.01); *C08G 2261/1424* (2013.01); *C08G 2261/3223* (2013.01); *C08G 2261/51* (2013.01); *C08G 2261/794* (2013.01); *C08K 3/04* (2013.01); *C08K 3/045* (2017.05); *C09D 165/00* (2013.01); *H01L 51/0037* (2013.01)

(58) Field of Classification Search
CPC .. C09D 183/00; C09D 183/04; C09D 183/14; C08K 3/04; C08K 3/045
See application file for complete search history.

(56) References Cited

U.S. PATENT DOCUMENTS

| | | | | | |
|---|---|---|---|---|---|
| 3,154,431 | A | * | 10/1964 | Santelli ................. | C07F 7/0834 209/51 |
| 3,850,772 | A | * | 11/1974 | Sekmakas ................. | C08F 8/42 204/493 |
| 6,261,638 | B1 | * | 7/2001 | van Ooij .................. | B05D 7/16 427/379 |
| 6,503,567 | B2 | * | 1/2003 | Ogawa .................... | B05D 1/185 427/341 |
| 2003/0157344 | A1 | * | 8/2003 | Shoup ......................... | C08J 7/04 428/447 |
| 2004/0234787 | A1 | * | 11/2004 | Ostrovsky ............... | C23C 18/36 428/447 |
| 2006/0005877 | A1 | * | 1/2006 | Spivack ............... | H01G 9/2031 136/263 |
| 2008/0246153 | A1 | | 10/2008 | Tsuchiya | |
| 2010/0062200 | A1 | * | 3/2010 | Domes ..................... | B05D 7/14 428/35.8 |
| 2010/0129674 | A1 | * | 5/2010 | Wei ..................... | C08G 73/0266 428/458 |
| 2010/0136462 | A1 | * | 6/2010 | Blunk ................. | H01M 8/0258 429/518 |

FOREIGN PATENT DOCUMENTS

| | | | |
|---|---|---|---|
| JP | 2001-187864 | | 7/2001 |
| JP | 2013-035966 | | 2/2013 |
| KR | 10-2005-0050597 | | 5/2005 |
| KR | 10-2009-0043397 | | 5/2009 |
| WO | 00/24831 | | 5/2000 |
| WO | 00/27939 | * | 5/2000 |
| WO | 2013-042278 | | 3/2013 |

OTHER PUBLICATIONS

European Patent Office, Supplementary European Search Report of Application No. EP 14779293.1, dated Nov. 11, 2016.

* cited by examiner

*Primary Examiner* — Margaret G Moore
(74) *Attorney, Agent, or Firm* — Lex IP Meister, PLLC

(57) ABSTRACT

The present invention relates to a coating composition comprising a bis-type silane compound, and particularly relates to a coating composition which has high storage stability and can form a highly transparent and high-strength coating film, a preparation method thereof and a coating film formed using the same.

9 Claims, 2 Drawing Sheets

PRECURSOR OF EX.1   PRECURSOR OF COM. EX.1

COATING COMPOSITION COMPRISING BIS-TYPE SILANE COMPOUND

FIELD OF THE INVENTION

The present invention relates to a coating composition comprising a bis-type silane compound, and particularly relates to a coating composition which has high storage stability and can form a highly transparent and high-strength coating film, a preparation method thereof and a coating film formed using the same.

BACKGROUND OF THE INVENTION

High-strength coating film manufacturing technology through a solution process has grown steadily with the development of scientific and industrial standards. In particular, various studies to combine the functionality of organic materials together with the high strength properties of inorganic materials are going on through the development of organic-inorganic hybrid materials, and visible results have been applied in many places.

Up to now, the most common high-strength coating material for solution process is tetraethylorthosilicate (TEOS) based silicon solution composition, and its greatest advantage is that it can achieve surface hardness similar to a glass film through the solution process. However, because of issues such as poor stability of the coating solution and a large shrinkage occurring during the curing process, it has not been widely applied across the industry so far.

To overcome this problem, various studies on a low-temperature glass film coating structure have been proceeding, of which Korea Patent Application No. 2009-0019226 disclosed a polysilazane ($R_2SiNH$)n. The silazane structure is a compound capable of naturally producing a silica structure at a low temperature, thereby increasing the silica content and achieving the high hardness of a glass film, and attempts to apply this have been made in many fields through a spray coating method, etc. However, this structure is very difficult to secure its reproducible synthesis, it is lack in stability in the air at a room temperature so that it needs numerous post-treatment processes to be done in its storage process, and this disadvantage leads to the lack of economic effect as well as the stability of a material itself, imposing a great restriction on its application fields. Due to the above problems, its commercialization with other functional materials is difficult, and it is difficult to secure a long-term stability and storage stability. Accordingly, its application is currently being made in a limited level. To overcome its restricted application limit, a new high-strength chemical structure for solution process must be designed first in consideration of the following aspects:

1. having a chemical structure with an excellent storage stability, but being able to change into a stable cured product during a curing process,
2. minimizing a change in surface characteristics such as moisture absorption after the film formation, and
3. having a good compatibility with various functional materials.

In addition, for its limitless application, it should show an excellent solution dispersion property to achieve a high compatibility with functional media.

SUMMARY OF THE INVENTION

In order to solve the above problems, it is an object of the invention to provide a coating composition which has a high storage stability in the solution, can be condensed at a very fast speed in the subsequent curing step, has high compatibility with functional materials, and can form a highly transparent and high-strength coating film, and a preparation method thereof.

Further, it is an object of the invention to provide a method of forming a coating film using the above coating composition, and a coating film formed by the coating film formation method.

Still further, it is an object of the invention to provide an article containing the above coating film.

To achieve the above objects, the present invention provides a coating composition comprising a bis-type silane compound represented by the following chemical formula 1, and a mixture solvent of an acidic or basic aqueous solution and an alcohol, wherein the ratio of Si—OH of chemical formula 1 is at least 50% of the total silane residue Si—R':

[Chemical formula 1]

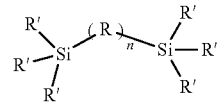

wherein,

R is selected from the group consisting of an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof;

R' is each independently selected from the group consisting of a hydroxyl group, an alkoxy group having 1 to 20 carbon atoms, an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof; and n is an integer of 1 to 20.

Also, the present invention provides a method of preparing a coating composition comprising stirring a silane compound represented by the following chemical formula 2 in a mixture solvent of an acidic or basic aqueous solution and an alcohol:

[Chemical formula 2]

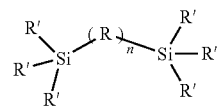

wherein,

R is selected from the group consisting of an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof;

R' is each independently selected from the group consisting of a hydroxyl group, an alkoxy group having 1 to 20 carbon atoms, an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof, with the proviso that at least two or more are a hydroxyl group or an alkoxy group; and n is an integer of 1 to 20.

Further, the present invention provides a coating composition prepared by the above preparation method of the coating composition.

Still further, the present invention provides a functional coating composition further comprising an organic functional material in addition to the above coating composition.

Further, the present invention provides a coating film prepared by coating and curing the above coating composition or functional coating composition on a base material.

Still further, the present invention provides an article containing the above coating film.

The coating composition of the invention enables a solution process, has excellent storage stability, and exhibits a high transmittance and high strength property when cured. In addition, when combined with organic functional materials, it exhibits high compatibility and excellent physical property. Furthermore, when the functional coating composition of the invention is applied across the industry, it can be widely used in a variety of fields such as a heat resistant light-sensitive material, a high refraction property based flexible substrate material, and a material for manufacturing special film.

DETAILED DESCRIPTION OF THE INVENTION

Figure 1:
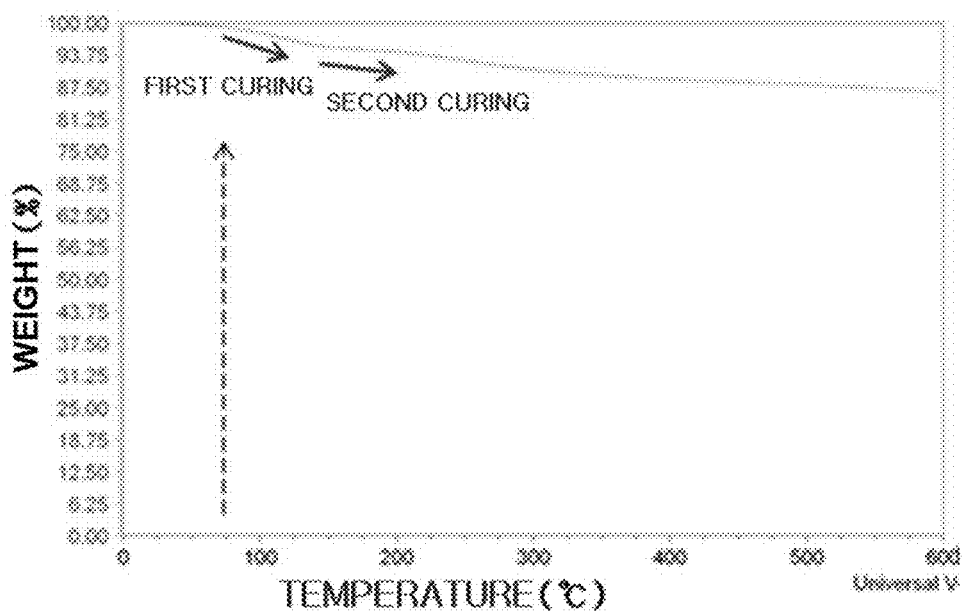
FIG. 1 is a graph showing the TGA thermal analysis results of the coating composition of Example 1 of the present invention.

Hereinafter, the invention will be described in detail.

The coating composition of the present invention comprises a bis-type silane compound represented by the following chemical formula 1, and a mixture solvent of an acidic or basic aqueous solution and an alcohol, wherein the ratio of Si—OH of chemical formula 1 is at least 50% of the total silane residue Si—R':

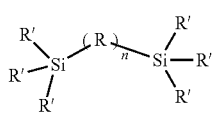

[Chemical formula 1]

wherein,

R is selected from the group consisting of an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof;

R' is each independently selected from the group consisting of a hydroxyl group, an alkoxy group having 1 to 20 carbon atoms, an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof; and n is an integer of 1 to 20.

Preferably, the ratio of Si—OH of chemical formula 1 may be at least 95% of the total Si—R', more preferably at least 98%. In this case, it is more advantageous for forming a coating film of high strength.

The above coating composition may be prepared by reacting a bis-type silane monomer of the following chemical formula 2 with an alcohol as a solvent in an acidic or basic aqueous solution:

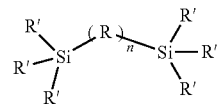

[Chemical formula 2]

wherein,

R is selected from the group consisting of an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof;

R' is each independently selected from the group consisting of a hydroxyl group, an alkoxy group having 1 to 20 carbon atoms, an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof, with the proviso that at least two or more are a hydroxyl group or an alkoxy group; and n is an integer of 1 to 20.

In the present invention, in order to obtain a stable coating composition, the pH of the acidic or basic aqueous solution (100 g) is not higher than 6.5 or not lower than 7.5 when one mole of the monomer is used, and the pH of the aqueous solution and the alcohol used as a solvent are characterized by having such a relationship that a value calculated by the following calculation formula 1 satisfies a range of 0.001 to 5.

(pH of aqueous solution 100 g/amount of alcohol (g))×100  [Calculation formula 1]

In the present invention, the value calculated according to the above calculation formula 1 may satisfy a range of 0.001 to 5, preferably 0.05 to 2. If the pH of the aqueous solution is not within the above range, the above calculation formula is not applicable.

Furthermore, there is no restriction on the kinds of the acids, bases and alcohols, and any kinds of them may be used as long as they are commonly used in the pertinent art.

The monomer in the coating composition of the present invention is in an organic-inorganic hybrid form, the alkoxy group or hydroxyl group represented by R' participates in precursor reaction, and the R serves to improve the surface properties by acting as an organic bridge in the curing process of the prepared precursor to minimize the shrinkage. In addition, even after prepared into a coating film after the curing process, the electronic environment of the organic bridge and silicon becomes greatly stable in comparison with conventional TEOS or silazane and therefore, it is a structure that can assure a high stability even after the process.

Accordingly, the precursor in the accordance with the present invention where the residual rate of Si—OH in the coating composition is high exists in a stable state while Si—OH of the bis-type silane is not being condensed, and in the subsequent condensation curing process by heat, it is simultaneously condensed at a fast speed, thereby to be able to prepare a high-density and high-strength film.

Further, the present invention provides a functional coating composition further comprising an organic functional material in addition to the above coating composition. More particularly, since the coating composition in accordance with the present invention exhibits excellent compatibility with various organic functional materials, the functional coating composition of the present invention may be a composition that comprises the bis-type silane monomer as a matrix binder and further comprises an organic functional material as a functional material.

In the present invention, the organic functional material may be functional materials that are commonly used in the pertinent art, preferably hydrophilic materials, and more preferably graphene, a conductive polymer or an organic dye. In the present invention, the organic functional material may be mixed in an amount of 0.005 to 90% by weight, preferably in an amount of 0.05 to 60% by weight.

The present invention provides a coating film prepared by coating and curing the above coating composition or functional coating composition on a base material.

In the present invention, the coating film may be prepared by methods that are commonly used in the pertinent art, and for example it can be prepared by coating the coating composition or functional coating composition on a base material which is selected for the intended purpose, and drying and heat-curing it.

In the present invention, a variety of coating methods that are commonly used in the pertinent art may be used, in particular a method using a solution process can be used, and preferably, by using a spin coating method, dipping method, bar coating method, roll coating method, spraying method, etc., the coating film can be printed on a commonly used transparent substrate, for example, a glass substrate, a polyimide (PI) substrate, a polyethylene terephthalate (PET) substrate, a polycarbonate (PC) substrate, a cycloolefin polymer (COP) substrate, a polyethylene naphthalate (PEN) substrate and so on. In addition, the coating thickness is preferably adjusted properly depending on its purpose.

The coating film may be cured by a conventional curing method, preferably a thermal curing method, and preferably it can be carried out at a temperature of 80 to 500° C.

The coating film prepared in accordance with the invention has excellent surface properties such as density and strength by using the precursor coating solution with a high Si—OH residual rate whereby the remaining Si—OH is simultaneously condensed at a fast speed during the curing process, and preferably it may have a hardness of not less than 8H, a transmittance of not less than 92%, and a sheet resistance of not more than 8.0 ohm/sq.

In addition, the functional coating film prepared from the functional coating composition further comprising the organic functional material shows not only a high transmittance, high strength and excellent sheet resistance, but also a stable performance with little change in the physical properties even when combined with organic functional materials and thus, it can be applied without limits in a variety of fields such as a heat resistant light-sensitive material, a high refraction property based flexible substrate material, and a material for manufacturing special film.

For a better understanding of the present invention, preferred examples follow. The following examples are intended to merely illustrate the invention without limiting the scope of the invention.

EXAMPLES

Example 1: Preparation of Stable Coating Composition Using Bis-Type Silane Monomer 100 G of 0.01 M aqueous hydrochloric acid solution was dropwise added to a dry flask equipped with a cooling tube and a stirrer, stirred for 10 min, and followed by the addition of 1000 g of ethanol so that a value of the following calculation formula (1) was adjusted to 0.2. One mole (354.59 g) of 1,2-bis(triethoxysilyl)ethane (BTSE) was dropwise added to the thus prepared mixture solvent, and stirred at a room temperature for 24 hours to prepare a coating composition.

(pH of aqueous solution 100 g/amount of alcohol (g))×100 [Calculation formula 1]

Comparative Example 1

Preparation of Coating Composition Using TEOS as Monomer

100 G of 0.01 M aqueous hydrochloric acid solution was dropwise added to a dry flask equipped with a cooling tube and a stirrer, stirred for 10 min, and after the addition of one mole of TEOS and 1000 g of ethanol, stirred at a room temperature for 24 hours to prepare a coating composition.

Test Example 1: Stability Test of Coating Composition

In order to examine a degree of hydrolysis and an amount of Si—OH that stably remains without being condensed in the coating compositions prepared in the above Example 1 and Comparative Example 1, $^1$H-NMR and $^{29}$Si-NMR were measured every 10 days for 60 days, and the results are shown in Table 1 below.

TABLE 1

| | Hydrolysis Rate (%)[a] | | | | | Si—OH Residual Rate (%)[b] | | | | |
|---|---|---|---|---|---|---|---|---|---|---|
| | Beginning | 10 days after | 20 days after | 40 days after | 60 days after | Beginning | 10 days after | 20 days after | 40 days after | 60 days after |
| Ex. 1 | 100 | 100 | 100 | 100 | 100 | 98.4 | 98.2 | 98.2 | 98.0 | 97.9 |
| Com. Ex. 1 | 100 | 100 | Gelation | — | — | 80.4 | 71.2 | gelation | — | — |

[a]residual amount of alkoxy groups calculated using $^1$H-NMR
[b]siloxane production amount calculated using $^{29}$Si-NMR As shown in Table 1 above, in the case of the coating composition of Comparative Example 1, gelation occurred within 20 days and reaction stability was remarkably deteriorated, whereas in the case of the coating composition of Example 1, only condensation rate change of 0.5% or so occurred during 60 days, and the residual rate of Si—OH was maintained in a stable state of more than 98%.

Test Example 2: Stability Test of Coating Composition

TGA measurement was carried out regarding the coating compositions prepared in above Example 1 and Comparative Example 1 to establish curing sections by heat, and the results are shown in FIG. 1.

As shown in FIG. 1, the beginning point of the first condensation and curing by heat was confirmed to be 80° C.

Figure 2:
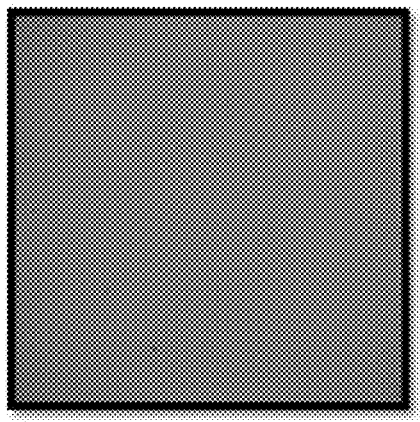
FIG. 2 is a microscope picture of the surfaces obtained after curing the coating compositions prepared in Example of the present invention and Comparative Example.
Figure 2:
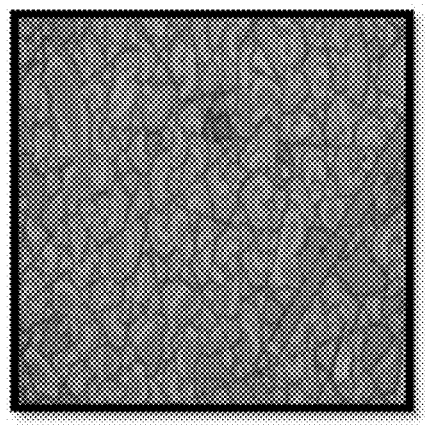

Further, surfaces prepared by coating the coating compositions on a glass substrate, and then curing them at 80° C. for one hour were observed for 60 days in the same manner as in Test Example 1, and a change in the surface hardness is shown in Table 2 below and its surface pictures are shown in FIG. 2.

TABLE 2

| | Pencil Hardness Change (H)[a] | | | | |
|---|---|---|---|---|---|
| | Beginning | 10 days after | 20 days after | 40 days after | 60 days after |
| Ex. 1 | 9H | 9H | 9H | 9H | 9H |
| Com. 1 | 8H | 6H | 5H | 3H | — |

[a]Mitsubishi pencil, 1 kgf, fail in the event that two times or more scratches out of five experiments occur As shown in Table 2 above, the TEOS based coating film of Comparative Example 1 showed a phenomenon in which the hardness was reduced due to the high film shrinkage and residual Si—OH. On the other hand, in Example 1, high hardness was maintained for a long time, and stable results could be obtained. This is a phenomenon resulting from the electronic stability of organic functional groups and silicon, and it is considered because a re-formation reaction of the produced siloxane did not occur. In addition, as shown in FIG. 2, it was confirmed that the coating film of Example 1 showed a very flat characteristic without cracking, but the TEOS based coating film of Comparative Example 1 was all shattered after 60 days.

Example 2: Preparation of Functional Coating Composition Using Graphene

A commercially available graphene manufactured by Hummers method of Korea Patent Application No. 2011-0119354 as an organic functional material was mixed in an amount of 0.1% by weight with the coating composition prepared in Example 1 and stirred for one day to prepare a functional coating composition.

Comparative Example 2: Preparation of Mixture Composition of Coating Composition of Comparative Example 1 and Graphene With the exception that the coating composition obtained in Comparative Example 1 was used instead of the coating composition prepared in Example 1, a mixture composition was prepared in the same manner as in Example 2.

Test Example 3: Characterization of Mixture Composition

For the characterization of the mixture compositions of above Example 2 and Comparative Example 2, the compositions were coated on a glass substrate. The coating films were cured under the same curing conditions as in Test Example 2 and then, transmittance and sheet resistance were measured for 60 days, and the results are shown in Table 3 below.

TABLE 3

| | Transmittance (%)[a] | | | | | Sheet Resistance (ohm/sq)[b] | | | | |
|---|---|---|---|---|---|---|---|---|---|---|
| | Beginning | 10 days after | 20 days after | 40 days after | 60 days after | Beginning | 10 days after | 20 days after | 40 days after | 60 days after |
| Ex. 2 | 95 | 94 | 95 | 95 | 94 | 6.8 | 6.8 | 6.7 | 6.8 | 6.8 |
| Com. Ex. 2 | 91 | 92 | 90 | 89 | 89 | 6.4 | 7.0 | 7.5 | 8.1 | 8.3 |

[a]measurement equipment is based on UV/visible light 500 nm, and the glass substrate is defined as a baseline.
[b]indicating exponent values in $1 \times 10^x$.

As shown in Table 3 above, it was confirmed that the coating film of Example 2 derived constant values in transmittance and sheet resistance which is a change value of electrical properties whereas the coating film of mixture of Comparative Example 2 showed a large-scale change in transmittance and sheet resistance due to the re-formation reaction of siloxane and unstable surface stability, etc.

Example 3: Preparation of Functional Coating Composition Using Conductive Polymer Doped poly(3,4-ethylenedioxythiophene)-poly(styrenesulfonate) as a commercially available conductive polymer was dissolved in 1% by weight aqueous solution of HG-KL15 of Hube Globe, Inc. and then, the thus prepared conductive polymer solution was mixed in an amount of 40% by weight with the coating composition obtained in Example 1 and stirred for one day to prepare a mixture composition.

Comparative Example 3: Preparation of Mixture Composition of Coating Composition of Comparative Example 1 and Conductive Polymer With the exception that the coating composition of Comparative Example 1 was used instead of the coating composition of Example 1, a mixture composition was prepared in the same manner as in Example 3.

Test Example 4: Characterization of Mixture Composition

For the characterization of the mixture compositions of above Example 3 and Comparative Example 3, the compositions were coated on a glass substrate. The coating films were cured under the same curing conditions as in Test Example 2 and then, transmittance and sheet resistance were measured for 60 days, and the results are shown in Table 4 below.

TABLE 4

| | Transmittance (%)[a] | | | | | Sheet Resistance (ohm/sq)[b] | | | | |
|---|---|---|---|---|---|---|---|---|---|---|
| | Beginning | 10 days after | 20 days after | 40 days after | 60 days after | Beginning | 10 days after | 20 days after | 40 days after | 60 days after |
| Ex. 3 | 92 | 92 | 92 | 92 | 92 | 7.5 | 7.5 | 7.6 | 7.6 | 7.6 |
| Com. Ex. 3 | 91 | 92 | 92 | 90 | 90 | 6.4 | 76 | 7.9 | 8.4 | 9.2 |

[a]measurement equipment is based on UV/visible light 500 nm, and the glass substrate is defined as a baseline.
[b]indicating exponent values in $1 \times 10^x$.

As shown in Table 4 above, it was confirmed that the coating film of mixture of Example 3 derived constant values in transmittance and sheet resistance which is a change value of electrical properties whereas the coating film of mixture of Comparative Example 3 showed a large-scale change in transmittance and sheet resistance due to the re-formation reaction of siloxane and unstable surface stability, etc.

Taken together the above results, the bis-type precursor of the present invention has a high transmittance and high strength property and also shows a stable performance with little change in physical properties even when combined with organic functional materials and therefore, it can be applied without limits in a variety of fields.

The coating composition of the invention enables a solution process, has excellent storage stability, and exhibits a high transmittance and high strength property when cured. In addition, when combined with organic functional materials, it exhibits high compatibility and excellent physical property. Furthermore, when the functional coating composition of the invention is applied across the industry, it can be widely used in a variety of fields such as a heat resistant light-sensitive material, a high refraction property based flexible substrate material, and a material for manufacturing special film.

What is claimed is:

1. A coating film comprising:
   a transparent substrate selected from the group consisting of a glass substrate, a polyimide (PI) substrate, a polyethylene terephthalate (PET) substrate, a polycarbonate (PC) substrate, a cycloolefin polymer (COP) substrate, and a polyethylene naphthalate (PEN) substrate, and
   a coating composition disposed on the transparent substrate comprising
   a bis-type silane compound represented by the following chemical formula 1,
   graphene or a conductive polymer, and
   a mixture solvent of an acidic or basic aqueous solution and an alcohol, wherein the ratio of Si—OH of chemical formula 1 is at least 50% of the total silane residue Si—R':

[Chemical formula 1]
   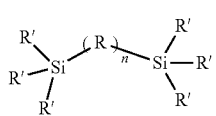

wherein,
   R is a divalent linking group selected from the group consisting of an alkyl group having 1 to 20 carbon atoms, a cycloalkyl group having 3 to 6 carbon atoms, an aryl group having 6 to 30 carbon atoms, and a combination thereof;
   R' is each independently selected from the group consisting of a hydroxyl group, an alkoxy group having 1 to 20 carbon atoms, an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof; and
   n is an integer of 1 to 20, and
   wherein the pH of the aqueous solution is not higher than 6.5 or not lower than 7.5,
   wherein the pH of the aqueous solution and the alcohol are characterized by having such a relationship that a value calculated by the following calculation formula 1 satisfies a range of 0.001 to 5:

(pH of aqueous solution 100 g/amount of alcohol (g))×100.       [Calculation formula 1]

2. The coating film according to claim 1, wherein the ratio of Si—OH of chemical formula 1 is at least 98% of the total silane residue Si—R'.

3. A method of preparing a coating film comprising:
   preparing a coating composition by stirring a silane compound represented by the following chemical formula 2 in a mixture solvent of an acidic or basic aqueous solution and an alcohol:

[Chemical formula 2]
   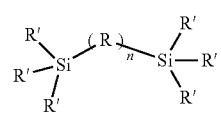

wherein,
   R is a divalent linking group selected from the group consisting of an alkyl group having 1 to 20 carbon atoms, a cycloalkyl group having 3 to 6 carbon atoms, an aryl group having 6 to 30 carbon atoms, and a combination thereof;
   R' is each independently selected from the group consisting of a hydroxyl group, an alkoxy group having 1 to 20 carbon atoms, an alkyl group having 1 to 20 carbon atoms, a cycloalkyl group having 3 to 6 carbon atoms, an aryl group having 6 to 30 carbon atoms, an amino group, a vinyl group, an epoxy group, a thiol group and a combination thereof, with the proviso that at least two or more are a hydroxyl group or an alkoxy group; and n is an integer of 1 to 20, and wherein the pH of the aqueous solution is not higher than 6.5 or not lower than 7.5, wherein the pH of the aqueous solution and the alcohol are characterized by having such a relationship that a value calculated by the following calculation formula 1 satisfies a range of 0.001 to 5:

(pH of aqueous solution 100 g/amount of alcohol (g))×100,  [Calculation formula 1]

mixing a graphene or a conductive polymer with the coating composition, and coating the mixed composition on a transparent substrate selected from the group consisting of a glass substrate, a polyimide (PI) substrate, a polyethylene terephthalate (PET) substrate, a polycarbonate (PC) substrate, a cycloolefin polymer (COP) substrate, and a polyethylene naphthalate (PEN) substrate, and, curing the mixed composition.

4. The method of preparing a coating film as claimed in claim 1, wherein the value calculated by calculation formula 1 satisfies a range of 0.05 to 2.

5. The coating film according to claim 1, wherein the graphene or the conductive polymer is included in an amount of 0.005 to 90% by weight of the coating composition.

6. The coating film as claimed in claim 1, wherein a hardness of the coating film is not less than 8H when the transparent substrate is coated with the composition and cured.

7. The coating film as claimed in claim 1, wherein a transmittance of the coating film is not less than 92% when the transparent substrate is coated with the composition and cured.

8. The coating film as claimed in claim 1, wherein a sheet resistance of the coating film is not more than 8.0 ohm/sq when the transparent substrate is coated with the composition and cured.

9. An article containing the coating film described in claim 1.

* * * * *